(12) United States Patent
Teitel et al.

(10) Patent No.: US 9,971,646 B2
(45) Date of Patent: May 15, 2018

(54) READING-THRESHOLD SETTING BASED ON DATA ENCODED WITH A MULTI-COMPONENT CODE

(71) Applicant: Apple Inc., Cupertino, CA (US)

(72) Inventors: Moti Teitel, Tel Aviv (IL); Tomer Ish-Shalom, Raanana (IL)

(73) Assignee: APPLE INC., Cupertino, CA (US)

(*) Notice: Subject to any disclaimer, the term of this patent is extended or adjusted under 35 U.S.C. 154(b) by 49 days.

(21) Appl. No.: 15/169,825

(22) Filed: Jun. 1, 2016

(65) Prior Publication Data

US 2017/0351569 A1 Dec. 7, 2017

(51) Int. Cl.
*G11C 29/00* (2006.01)
*G06F 11/10* (2006.01)
*H03M 13/11* (2006.01)
*G11C 29/52* (2006.01)

(52) U.S. Cl.
CPC .......... *G06F 11/1068* (2013.01); *G11C 29/52* (2013.01); *H03M 13/1148* (2013.01)

(58) Field of Classification Search
CPC . G06F 11/1068; G11C 29/52; H03M 13/1148
See application file for complete search history.

(56) References Cited

U.S. PATENT DOCUMENTS

| | | | |
|---|---|---|---|
| 7,558,109 B2 | 7/2009 | Brandman et al. | |
| 7,904,793 B2 | 3/2011 | Mokhlesi et al. | |
| 8,156,398 B2 | 4/2012 | Sommer | |
| 8,243,511 B2 | 8/2012 | Patapoutian et al. | |
| 8,259,506 B1 | 9/2012 | Sommer et al. | |
| 8,468,424 B2 | 6/2013 | Mokhlesi et al. | |
| 8,508,995 B2 | 8/2013 | Weingarten et al. | |
| 8,510,639 B2 | 8/2013 | Steiner et al. | |
| 8,547,740 B2 | 10/2013 | Sommer et al. | |
| 8,627,175 B2 | 1/2014 | Patapoutian et al. | |
| 8,627,188 B2 | 1/2014 | Weingarten et al. | |
| 8,782,495 B2 | 7/2014 | Alrod et al. | |
| 8,869,008 B2 | 10/2014 | Baum et al. | |
| 8,996,793 B1 | 3/2015 | Steiner et al. | |
| 2011/0041040 A1 | 2/2011 | Su et al. | |
| 2011/0161775 A1* | 6/2011 | Weingarten | G06F 11/1048 714/755 |
| 2014/0219028 A1 | 8/2014 | Alhussien et al. | |

(Continued)

*Primary Examiner* — Thien Nguyen
(74) *Attorney, Agent, or Firm* — D. Kligler IP Services Ltd.

(57) ABSTRACT

A storage device includes a memory that includes storage circuitry and a memory including multiple memory cells. The storage circuitry is configured to store in a group of the memory cells data that was encoded using an error correcting code (ECC) consisting of multiple component codes, to define multiple threshold settings, each specifying positions of one or more reading-thresholds, to read the data from the memory cells in the group using the threshold settings and decode the read data using the component codes, to calculate for the component codes respective component-code scores that are indicative of levels of confidence in the decoded data of the component-codes, to select, based on the component-code scores, a threshold setting that is expected to result in a best readout performance among the multiple threshold settings, and to read data from the memory using the selected threshold setting.

18 Claims, 4 Drawing Sheets

(56) References Cited

U.S. PATENT DOCUMENTS

| | | | | |
|---|---|---|---|---|
| 2014/0331106 A1* | 11/2014 | Baum | .................. | G06F 11/10 |
| | | | | 714/766 |
| 2016/0179615 A1* | 6/2016 | Lee | .................. | G11C 29/52 |
| | | | | 714/764 |
| 2016/0197623 A1* | 7/2016 | Varanasi | ............. | G11C 11/5621 |
| | | | | 714/764 |

* cited by examiner

READING-THRESHOLD SETTING BASED ON DATA ENCODED WITH A MULTI-COMPONENT CODE

TECHNICAL FIELD

Embodiments described herein relate generally to memory devices, and particularly to methods and systems for setting reading-thresholds based on data stored encoded using a multi-component error correction code.

BACKGROUND

Several types of memory devices, such as Flash memories, use arrays of analog memory cells for storing data. The memory cells are programmed to respective predefined programming states or levels in accordance with the data being stored. For enhanced reliability, the data is typically encoded with some error correction code (ECC) before programmed to the memory cells, and decoded using the same ECC upon read from the memory cells. Retrieving data from the memory typically involves reading the memory cells using one or more reading-thresholds. Setting the reading-thresholds accurately is important for achieving low readout error rate.

Various techniques for setting the reading-thresholds and other read parameters for reading analog memory cells are known in the art. For example, U.S. Pat. No. 8,156,398, whose disclosure is incorporated herein by reference, describes a method for operating a memory, which includes analog memory cells, the method includes encoding data with an Error Correction Code (ECC) that is representable by a plurality of equations. The encoded data is stored in a group of the analog memory cells by writing respective input storage values to the memory cells in the group. Multiple sets of output storage values are read from the memory cells in the group using one or more different, respective read parameters for each set. Numbers of the equations, which are satisfied by the respective sets of the output storage values, are determined. A preferred setting of the read parameters is identified responsively to the respective numbers of the satisfied equations. The memory is operated on using the preferred setting of the read parameters.

As another example, U.S. Pat. No. 8,869,008, whose disclosure is incorporated herein by reference, describes a method including storing data that is encoded with an Error Correction Code (ECC) in a group of analog memory cells. The memory cells in the group are read using multiple sets of read thresholds. The memory cells in the group are divided into two or more subsets. N partial syndromes of the ECC are computed, each partial syndrome computed over readout results that were read using a respective set of the read thresholds from a respective subset of the memory cells. For each possible N-bit combination of N bit values at corresponding bit positions in the N partial syndromes, a respective count of the bit positions in which the combination occurs is determined, so as to produce a plurality of counts. An optimal set of read thresholds is calculated based on the counts, and data recovery is performed using the optimal read thresholds.

U.S. Pat. No. 8,508,995, whose disclosure is incorporated herein by reference, describes a system and method for adjusting read threshold voltage values, for example, in a read circuit internal to a memory device. The quality of an associated read result may be estimated for each read threshold voltage value used to read memory cells. Only read results estimated to have sufficient quality may be allowed to pass to storage. The read threshold voltage value may be adjusted for subsequent read operations, for example, if the associated read result is estimated to have insufficient quality. The read threshold voltage value may be iteratively adjusted, for example, until a read result is estimated to have sufficient quality.

SUMMARY

An embodiment that is described herein provides a storage device including storage circuitry and a memory. The memory includes multiple memory cells. The storage circuitry is configured to store in a group of the memory cells data that was encoded using an error correcting code (ECC) consisting of multiple component codes, to define multiple threshold settings, each specifying positions of one or more reading-thresholds, to read the data from the memory cells in the group using the threshold settings and decode the read data using the component codes, to calculate for the component codes respective component-code scores that are indicative of levels of confidence in the decoded data of the component-codes, to select, based on the component-code scores, a threshold setting that is expected to result in a best readout performance among the multiple threshold settings, and to read data from the memory using the selected threshold setting.

In some embodiments, the ECC includes a generalized low-density parity-check (GLDPC) code, and the storage circuitry is configured to store the data encoded using the GLDPC code. In other embodiments, the storage circuitry is configured to calculate the component-code scores based on first reading-thresholds having first respective positions, to define, based on the selected threshold setting, second reading-thresholds having second positions different from the first positions, and to calculate the component-code scores based on the second reading-thresholds. In yet other embodiments, the storage circuitry is configured to calculate the component-code scores by decoding a given component code beyond half a minimum distance of the component codes to produce one or more error-pattern candidates, calculating for each error-pattern candidate a respective candidate-score, and calculating the component-code score corresponding to the given component code based on the candidate-scores.

In an embodiment, the storage circuitry is configured to identify a most reliable error pattern among the error-pattern candidates, and to assign the candidate-score of the identified error pattern as the component-code score. In another embodiment, the storage circuitry is configured to assign multiple zone-reliability metrics to threshold-voltage zones defined by the reading-thresholds, to identify to which zones the memory cells corresponding to the erroneous bits in the respective error-pattern candidate belong, and to calculate the candidate-score based on the respective zone-reliability metrics. In yet another embodiment, the storage circuitry is configured to calculate for each of the threshold settings a respective threshold-setting score by averaging the respective component-code scores, and to select the threshold setting based on the calculated threshold-setting scores.

In some embodiments, the storage circuitry is configured to average the component-code scores whose values exceed a predefined score-threshold. In other embodiments, the storage circuitry is configured to average a predefined number of the component-code scores having highest values among the component-code scores.

There is additionally provided, in accordance with an embodiment that is described herein, a method in a memory that includes multiple memory cells, including storing in a group of the memory cells data that was encoded using an error correcting code (ECC) consisting multiple component codes. Multiple threshold settings are defined, each specifying positions of one or more reading-thresholds. The data is read from the memory cells in the group using the threshold settings, and the read data is decoded using the component codes. Component-code scores are calculated for the respective component codes that are indicative of levels of confidence in the decoded data of the component-codes. Based on the component-code scores, a threshold setting that is expected to result in a best readout performance among the multiple threshold settings is selected. Data is read from the memory using the selected threshold setting.

These and other embodiments will be more fully understood from the following detailed description of the embodiments thereof, taken together with the drawings in which:

DETAILED DESCRIPTION OF EMBODIMENTS

Overview

Figure 1:
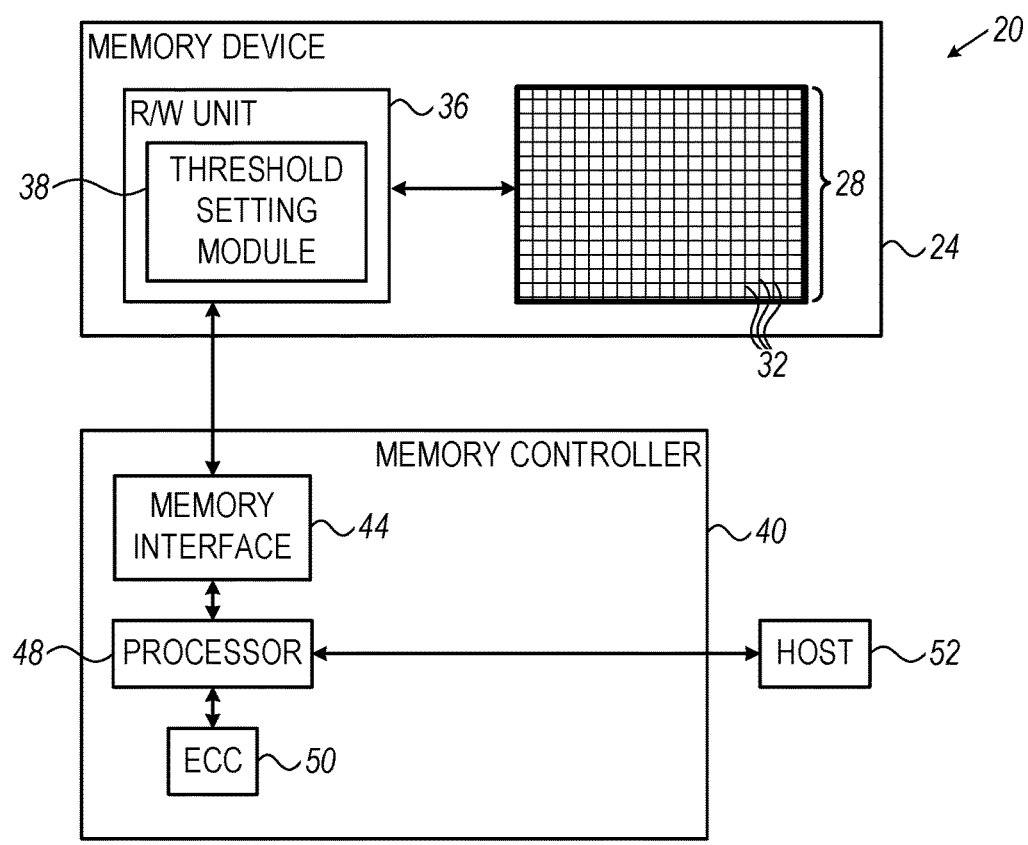
FIG. 1 is a block diagram that schematically illustrates a memory system, in accordance with an embodiment that is described herein.

Various types of memory devices store data in multiple memory cells, such as analog Flash cells. The memory cells are programmed to assume nominal respective storage values, e.g., threshold voltages, from a finite set of predefined storage values. For example, a 2 bit/cell MLC memory device can be programmed to assume one of four possible programming levels by writing one of four possible nominal storage values into the cell.

The threshold voltages, which the memory cells actually assume, are distributed about the nominal threshold voltages. Reading the memory cells typically involves setting one or more reading-thresholds, e.g., at mid-positions between adjacent distributions, and sensing the states of the memory cells to determine their threshold voltages relative to the reading-thresholds. Positioning the reading-thresholds correctly is essential for achieving optimal readout performance.

Various reasons may cause degradation to the readout performance. For example, extensive usage of the device, using the device toward its end-of-life, or using the device at extreme environmental conditions, may cause the threshold-voltage distributions to drift, widen or become otherwise distorted, so that the reading-thresholds become un-optimally positioned.

In some situations, e.g., when first using the memory device after production or after long retention, the threshold-voltage distributions are unknown, or may have changed considerably. In such cases, the uncertainty of the correct positions of the reading-thresholds is large and a searching process, also referred to as "reading-threshold acquisition" is required.

Note that reading data that is encoded with some error correction code (ECC) using thresholds that are set far from their optimal positions, may result in decoding failure of the ECC, and therefore may fail the acquisition process as well. Moreover, when the ECC comprises a multi-component ECC, most or all of the component codes of the ECC may fail to decode correctly.

Embodiments that are described herein provide methods and systems for setting reading-thresholds, based on stored data that is encoded with a multi-component ECC. The multi-component ECC may comprise, for example, a generalized low-density parity-check (GLDPC) code. The underlying component codes may comprise any suitable code such as a Bose-Chaudhuri-Hocquenghem (BCH) code.

In the disclosed embodiments, a memory controller that controls the memory device defines multiple threshold settings, each comprising one or more reading-thresholds, depending on the underlying storage scheme. For example, in a four-level 2 bits/cell Multi-Level Cell (MLC) Flash memory, a threshold setting for reading least significant bit (LSB) data typically comprises a single reading-threshold, whereas a threshold setting for reading most significant bit (MSB) data typically comprises two reading-thresholds. The memory controller scans the multiple threshold settings to find a "best" threshold setting.

In the context of the present disclosure, the term "best" threshold setting refers to a threshold setting that results in optimal or close to optimal readout performance in accordance with some criterion. The performance criterion may aim to achieve, for example, a minimal bit error rate (BER), or a minimal signal to noise ratio (SNR) of the readout results for which the ECC is decodable. Alternatively, any other suitable criterion can also be used.

The multiple threshold settings essentially divide the threshold-voltage axis into zones. Zones can be assigned reliability measures or metrics in various ways. For example, consider a set S of multiple readout results that belong to a given zone, i.e., the readout results fall within the lower and upper edges defining the zone. In addition, let N0 and N1 denote the numbers of readout results in S corresponding to transmitted/stored logical levels '0' and '1', respectively. The reliability measure for the given zone depends on the ratio N0/N1, wherein a unity ratio corresponds to the lowest reliability, and the more N1 and N0 differ from one another, the more reliable the zone is considered to be. A readout result (bit value) of a given memory cell may be regarded as highly reliable if the threshold voltage of that memory cell falls in one zone, and less reliable if the threshold voltage falls in another zone. In some embodiments, the memory controller calculates zone-reliability metrics for the multiple zones defined by the reading-thresholds of the threshold settings.

The zone-reliability metrics are typically soft metrics that are based on several sub-metrics such as zone a-priori bit error probability, zone a-priori probability, and total a-priori bit error probability. In some embodiments, the memory controller calculates and stores the zone-reliability metrics before carrying out the acquisition process. The zone-reliability metrics are used for calculating score values for the component codes of the ECC. In some embodiments, the data used for calculating zone-reliability metrics is encoded using a GLDPC code.

In some embodiments, the memory controller reads encoded data from a group of the memory cells multiple times, using different respective threshold-settings, and for each threshold setting decodes the read data using each of the component codes. Unlike conventional decoding, the component codes are decoded beyond half the minimum distance of the component codes, to produce multiple candidate error patterns.

For a given component code, the memory controller uses the zone-reliability metrics to calculate for each error-pattern candidate a respective candidate-score. The candidate-score of the most reliable error pattern is assigned as the component-code score of the given component code. This process is carried out in a similar manner per component code.

The memory controller then uses the component-code scores of the various component codes to select the best threshold setting. In one embodiment, the memory controller averages the component-code scores per each threshold setting, and selects the threshold setting for which this average score is maximal. In another embodiment, the memory controller averages the component-code scores only for a predefined number of highest score values or over score values that are above a predefined score-threshold.

In some embodiments, the reading-thresholds of the selected threshold setting are used as anchors for updating the threshold setting for a subsequent acquisition-iteration. The reading-thresholds of the updated threshold settings are typically chosen to sample the threshold-voltage axis at a finer resolution.

By using the disclosed techniques, the reading-thresholds can be set based on data that is encoded with a multi-component ECC even when a large number of these component codes fail to decode correctly. As such, the disclosed techniques can be used at low SNR values that are common in acquisition scenarios. Nevertheless, the disclosed techniques may also be used for on-going tracking of the correct positions of the reading-thresholds.

System Description

FIG. 1 is a block diagram that schematically illustrates a memory system 20, in accordance with an embodiment that is described herein. System 20 can be used in various host systems and devices, such as in computing devices, cellular phones or other communication terminals, removable memory modules, Solid State Disks (SSD), Secure Digital (SD) cards, Multi-Media Cards (MMC) and embedded MMC (eMMC), digital cameras, music and other media players and/or any other system or device in which data is stored and retrieved.

System 20 comprises a memory device 24, which stores data in a memory cell array 28. The memory array comprises multiple memory cells 32, such as analog cells. In the context of the present patent application and in the claims, the term "analog memory cell" is used to describe any memory cell that holds a continuous, analog value of a physical parameter, such as an electrical voltage or charge. Array 28 may comprise solid-state analog memory cells 32 of any kind, such as, for example, NAND, NOR and Charge Trap Flash (CTF) Flash cells, phase change RAM (PRAM, also referred to as Phase Change Memory—PCM), Nitride Read Only Memory (NROM), Ferroelectric RAM (FRAM), magnetic RAM (MRAM) and/or Dynamic RAM (DRAM) cells. Although the embodiments described herein refer mainly to analog memory, the disclosed techniques may also be used with various other memory types.

The charge levels stored in the cells and/or the analog voltages or currents written into and read out of the cells are referred to herein collectively as analog values, storage values or analog storage values. Although the embodiments described herein mainly address threshold voltages, the methods and systems described herein may be used with any other suitable kind of storage values.

System 20 stores data in the memory cells 32 by programming the memory cells to assume respective memory states, which are also referred to as programming levels. The programming levels are selected from a finite set of possible levels, and each level corresponds to a certain nominal storage value. For example, a 2 bit/cell MLC can be programmed to assume one of four possible programming levels by writing one of four possible nominal storage values into the cell.

Memory device 24 comprises a reading/writing (R/W) unit 36, which converts data for storage in the memory device to analog storage values and writes them into memory cells 32. In alternative embodiments, the R/W unit does not perform the conversion, but is provided with voltage samples, i.e., with the storage values for storage in the cells. When reading data out of array 28, R/W unit 36 converts the storage values of memory cells 32 into digital samples having an integer resolution of one or more bits. Data is typically written to and read from the memory cells in groups that are referred to as pages. In some embodiments, the R/W unit can erase a group of cells 32 by applying one or more negative erasure pulses to the cells.

R/W unit 36 comprises a threshold setting module 38, which is configured to set one or more reading-thresholds under the control of memory controller 40. For example, in a 2 bits/cell MLC device, for reading a least significant bit (LSB) page the memory controller typically sends a command to module 38 within the R/W unit to set a single threshold, whereas for reading a most significant bit (MSB) page the memory controller typically configures module 38 to set two reading-thresholds. In some embodiments, a command for setting a reading-threshold comprises a numerical value, which the R/W unit maps to a respective threshold voltage at a predefined resolution, e.g., in units of millivolts.

When reading a group of memory cells using a given reading-threshold, the R/W unit senses the cells states to decide whether their threshold voltages are above or below the reading-threshold. Positioning the reading-thresholds correctly, especially at low signal to noise ratios (SNR) of the readout results, is essential for retrieving the data with minimal error rate.

The storage and retrieval of data in and out of memory device 24 is performed by a memory controller 40. Memory controller 40 comprises an interface 44 for communicating with memory device 24, a processor 48, and an Error Correcting Code (ECC) unit 50. The disclosed techniques can be carried out by memory controller 40, by R/W unit 36, or both. Thus, in the present context, memory controller 40 and R/W unit 36 are referred to collectively as storage circuitry that carries out the disclosed techniques.

Memory controller 40 communicates with a host 52, for accepting data for storage in the memory device and for outputting data retrieved from the memory device. ECC unit 50 encodes the data for storage using a suitable ECC and decodes the ECC of data retrieved from the memory. The disclosed techniques refer mainly to an ECC that comprises multiple component codes, such as, for example, a generalized low-density parity-check (GLDPC) code.

Memory controller 40 may be implemented in hardware, e.g., using one or more Application-Specific Integrated Circuits (ASICs) or Field-Programmable Gate Arrays (FPGAs). Alternatively, the memory controller may comprise a microprocessor that runs suitable software, or a combination of hardware and software elements.

The configuration of FIG. 1 is an example system configuration, which is shown purely for the sake of conceptual clarity. Any other suitable memory system configuration can also be used. For example, although the example of FIG. 1 shows a single memory device, in alternative embodiments memory controller 40 may control multiple memory devices 24, e.g., in a RAID storage system. Elements that are not necessary for understanding the principles of the present disclosure, such as various interfaces, addressing circuits, timing and sequencing circuits and debugging circuits, have been omitted from the figure for clarity.

In the example system configuration shown in FIG. 1, memory device 24 and memory controller 40 are implemented as two separate Integrated Circuits (ICs). In alternative embodiments, however, the memory device and the memory controller may be integrated on separate semiconductor dies in a single Multi-Chip Package (MCP) or System on Chip (SoC), and may be interconnected by an internal bus. Further alternatively, some or all of the storage circuitry may reside on the same die on which the memory array is disposed. Further alternatively, some or all of the functionality of memory controller 40 can be implemented in software and carried out by a processor or other element of the host system. In some embodiments, host 52 and memory controller 40 may be fabricated on the same die, or on separate dies in the same device package.

In some embodiments, memory controller 40 comprises a general-purpose processor, which is programmed in software to carry out the functions described herein. The software may be downloaded to the processor in electronic form, over a network, for example, or it may, alternatively or additionally, be provided and/or stored on non-transitory tangible media, such as magnetic, optical, or electronic memory.

Reliability Metrics in Reading Raw Data

Figure 2:
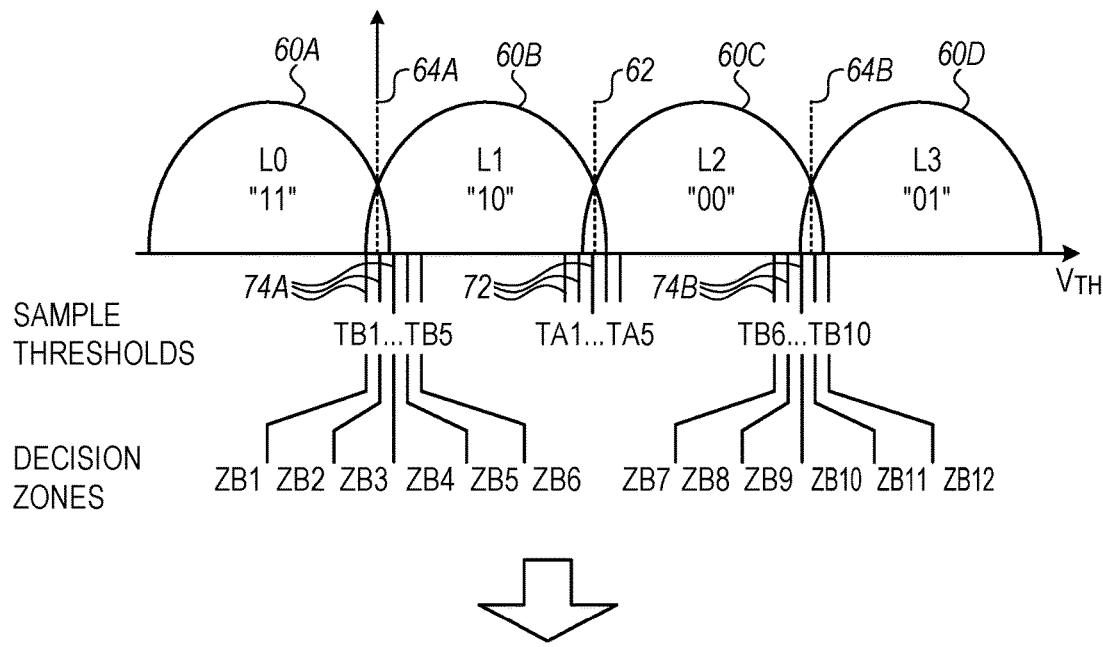
FIG. 2 is a diagram that schematically illustrates threshold-voltage distributions of memory cells that are read using multiple threshold settings to produce respective zone-reliability metrics, in accordance with an embodiment that is described herein.

FIG. 2 is a diagram that schematically illustrates threshold-voltage distributions of memory cells that are read using multiple threshold settings to produce respective zone-reliability metrics, in accordance with an embodiment that is described herein. FIG. 2 refers to a MLC memory device whose memory cells are programmed to four nominal programming levels denoted L0 . . . L3. The threshold voltages of the memory cells at levels L0 . . . L3 are distributed in accordance with respective distributions 60A . . . 60D.

In the present example, bit pairs "11", "10", "00", and "01" are mapped to respective programming levels L0, L1, L2 and L3. A bit pair comprises a least significant bit (LSB) and a most significant bit (MSB), wherein the LSB is the left bit and the MSB is the right bit. For example, in the bit pair "10" LSB=1 and MSB=0. In alternative embodiments other suitable mapping schemes can also be used.

Reading LSB data typically requires setting a single reading-threshold so that memory cells programmed above or below the reading-threshold read LSB data "0" or "1", respectively. A vertical dotted line 62 denotes a reading-threshold optimally positioned for reading LSB data. Similarly, vertical dotted lines 64A and 64B denote reading-thresholds optimally positioned for reading MSB data, so that memory cells that assume threshold voltages between lines 64A and 64B read MSB=0, whereas memory cells programmed below line 64A or above line 64B read MSB=1.

A readout error in a given memory cell occurs when the memory cell is programmed to some nominal level, but actually assumes a threshold voltage of another (typically adjacent) nominal level. For example, the threshold voltage of a memory cell programmed to L1 belongs to distribution 60B for which LSB=1, but the cell may assume a threshold voltage above line 62, and therefore wrongly read as LSB=0. A reading-threshold positioned at line 62 is optimal for achieving minimal bit error rate (BER) in reading LSB data. Similarly, lines 64A and 64B (together) represent optimal reading-threshold positions for achieving minimal BER in reading MSB data.

In the embodiments disclosed below, the data is stored encoded using a suitable ECC that comprises multiple component codes. Note that reading the memory cells using non-optimal reading-thresholds may result in a large number of errors that may exceed the error-correction capability of the ECC. Moreover, at low SNR values of the readout results, a large number of the component codes may fail to decode correctly. In the disclosed embodiments, the memory device reads a group of memory cells (e.g., a page) using multiple different threshold settings, each comprising one or more reading-thresholds depending on the underlying reading scheme, and selects a threshold setting that is expected to result in minimal BER.

In the present example, a threshold setting for reading LSB data comprises a single reading-threshold, and a threshold setting for reading MSB data comprises two reading-thresholds. In the example of FIG. 2, a group of five reading-thresholds is defined in the vicinity of each optimal reading-threshold. Thus, reading-thresholds 72, denoted TA1 . . . TA5, are defined in the vicinity of line for reading LSB data, whereas reading-thresholds 74A and 74B, denoted TB1 . . . TB5 and TB6 . . . TB10, are defined in the vicinities of lines 64A and 64B, respectively, for reading MSB data. Note that in FIG. 2, TA1 . . . TA5 are well centered about line 62, but the reading-threshold groups TB1 . . . TB5 and TB6 . . . TB10 are shifted with respect to their optimal positions.

The reading-thresholds partition the threshold-voltage axis into zones or bins. As seen in FIG. 2, reading-thresholds TB1 . . . TB10 plus line 62 partition the threshold-voltage axis into twelve zones denoted ZB1 . . . ZB12. Memory cell are associated with zones based on the threshold voltages the memory cells assume. For example, memory cells whose threshold voltage falls below TB1 belong to zone ZB1. Similarly, memory cells whose threshold voltage falls between TB1 and TB2 belong to zone ZB2, and so on.

By reading the memory cells using multiple different threshold settings, the threshold voltages of the memory cells can be associated with the zones defined by the respective reading-thresholds. In some embodiments, the memory controller calculates, for a given threshold setting zone-reliability metrics for the zones defined by the reading-thresholds of the threshold setting. As will be described in detail below, the zone-reliability metrics are used for calculating scores for error patterns suggested by the component codes of the ECC.

The lower part of FIG. 2, depicts a table comprising threshold settings used for reading MSB data, and respective zone-reliability metrics, denoted RM1... RM25. Since each threshold setting comprises a threshold-pair TBi, TBj, wherein 1≤i≤5, and 6≤j≤10, the total number of possible MSB threshold settings is $5^2=25$, in this example. The zone-reliability metrics are multi-dimensional metrics having a reliability level per zone. In the example of FIG. 2, each zone-reliability metric comprises a vector of length 12 corresponding to zones ZB1... ZB12.

In some embodiments, the zone-reliability metric is a soft metric calculated based on the following sub-metrics:

M1: Zone a-priori bit error probability
M2: Zone a-priori probability
M3: Total a-priori bit error probability
M4: Empirical zone probability In some embodiments, the zone-reliability metric comprises a weighted average of some or all of the sub-metrics M1, M2, M3 and M4. Note that sub-metrics M1... M3 are based on the channel matrix. The zone-reliability metric and the sub-metrics M1... M4 are referred to collectively as metrics.

In some embodiments, the sub-metrics M1... M4 are given mathematically by the following expressions:

$$M1=\log [P(Z=z|e)] \quad \text{Equation 1:}$$

wherein P(Z=z|e) is the probability of receiving zone z given that an error had occurred.

$$M2=\log [P(Z=z)] \quad \text{Equation 2:}$$

wherein P(Z=z) denotes the ratio between the number of readout results falling in zone z relative to the total number of readout results, and wherein the distribution P(•) is observed in the lab beforehand.

$$M3=\log [Pe] \quad \text{Equation 3:}$$

wherein Pe is the raw BER (the probability of error in the input).

$$M4=\log [P(Z=z)] \quad \text{Equation 4:}$$

wherein P(Z=z) denotes the ratio between the number of readout results falling in zone z relative to the total number of readout results, wherein the distribution P(•) is observed online.

In some embodiments, the memory controller searches an optimal threshold setting using predefined reading-thresholds specifying a predefined respective sampling resolution of the threshold-voltage axis. In such embodiments, the memory controller estimates the channel matrix beforehand, calculates the sub-metrics M1 ... M3 based on the channel matrix and calculates M4 based on online measurements, and stores the sub-metrics in a table to be uses during the threshold acquisition process. In an embodiment, instead of storing M1... M4 separately, the memory controller stores only the weighted average of M1... M4.

In some embodiments, the memory controller stores the metrics in multiple tables that each corresponds to a different SNR value. During threshold acquisition, the memory controller estimates the SNR, and based on the estimated SNR retrieves the metrics from the relevant table. In other embodiments, the memory controller stores the metrics for only one SNR value. In such embodiments, some performance degradation may be incurred when the actual SNR is different from the SNR that was used for calculating the metrics.

Selection of Best Threshold-Setting Using Component-Code Scores

Figure 3:
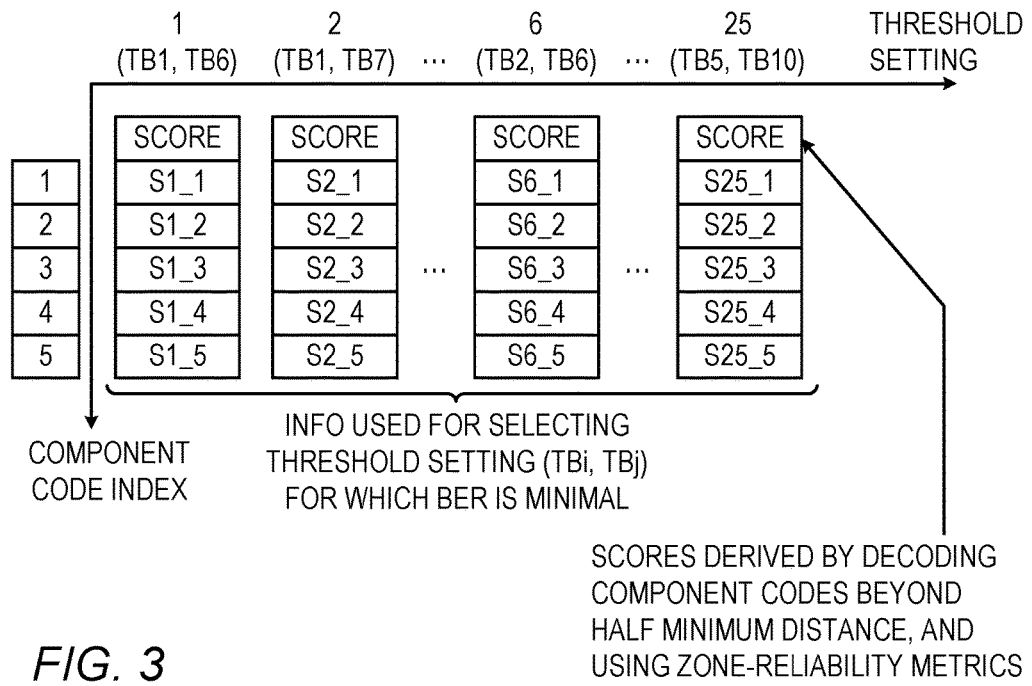
FIG. 3 is a diagram that schematically illustrates component-code scores used for selecting a best threshold setting, in accordance with an embodiment that is described herein.

FIG. 3 is a diagram that schematically illustrates component-code scores used for selecting a best threshold setting, in accordance with an embodiment that is described herein. FIG. 3 refers to a multi-component ECC comprising five component codes. The ECC may comprise, for example, a GLDPC code with BCH or other suitable component codes. The number of five component codes is given by way of example, and other number of component codes can also be used. For example, a practical GLDPC code may comprise tens or even several hundred component codes.

FIG. 3 is described with reference to the threshold settings depicted in FIG. 2 for reading MSB data. The diagram in FIG. 3 depicts a database (DB) in which the memory controller stores, for each of the 25 threshold settings of FIG. 2, component-code scores for the five component codes. In the diagram, Sm_n denotes the score value associated with a threshold-setting index 1≤m≤25 and a component-code index 1≤n≤5.

The minimum distance of the component codes determines their error-correction capability. For example, a BCH component code with a minimum (hamming) distance 7 can correct up to 3 errors. In the disclosed embodiments, the component codes are decoded beyond half their minimum distance. To this end, decoding the component code involves generating a list of one or more error-pattern candidates. Alternatively, decoding the component code beyond half the minimum distance fails to find any acceptable error pattern. For a BCH component code that can correct up to 3 errors, the decoding results in a single error-pattern when the true number of errors is up to three. The number of error-pattern candidates is typically about several tens when four or more errors had occurred.

Given an error-pattern list, the memory controller calculates scores for the error-pattern candidates in the list using the zone-reliability metrics described above. In some embodiments, to calculate the score of a given error pattern, the memory controller applies the following processing steps:

STEP1: Identify the memory cells for which the error-pattern indicates a decoding error.
STEP2: Identify the zones to which the identified memory cells belong.
STEP3: Retrieve from the relevant table (or calculate) the zone-reliability metrics of the zones identified at STEP2.
STEP4: Sum the zone-reliability metrics to derive a candidate-score for the error-pattern candidate.

The memory controller uses the candidate-scores for selecting the most reliable error-pattern candidate in the list, and uses this candidate-score as the component-code score.

In some situations, decoding a component code may fail to find any acceptable error pattern, in which case the list of error-pattern candidates remains empty. In such a case, the memory controller may assign to this component code a default predefined score value. Alternatively, the memory controller may exclude the respective component code (and its undetermined score) in selecting the best threshold setting.

As noted above, the memory controller stores in the DB multiple component-code scores for each of the threshold settings. The component-code scores calculated as described above represent decoding confidence-levels of the respective component codes. The memory controller uses the component-code scores for selecting the threshold setting that is expected to result in minimal BER.

For example, in some embodiments, the memory controller selects the threshold setting for which the number of component codes whose decoding resulted in at least one error pattern is the largest. In other embodiments, the memory controller sums of number of errors successfully corrected (i.e., for error-patterns containing up to three errors) over the component codes of each threshold setting, and selects the threshold setting for which this sum is minimal.

In some embodiments, the memory controller calculates threshold-setting scores, based on the respective component-code scores, and selects the best threshold setting based on the threshold-setting scores. For example, in one embodiment, the memory controller calculates the threshold-setting scores by calculating an average of the component-code scores of each threshold setting. In another embodiment, the memory controller averages the component-code scores over a partial subset of the component-code scores per each threshold setting.

For example, the memory controller may average the component-code scores over a predefined fraction of the component-code scores, or over a predefined number of component-code scores having the highest score values (i.e., scores of the most reliable error patterns). In some embodiments, the memory controller calculates the threshold-setting scores by averaging only component-code scores that are higher than a predefined score-threshold. Considerations in determining the score-threshold are described herein with reference to FIG. 4.

Figure 4:
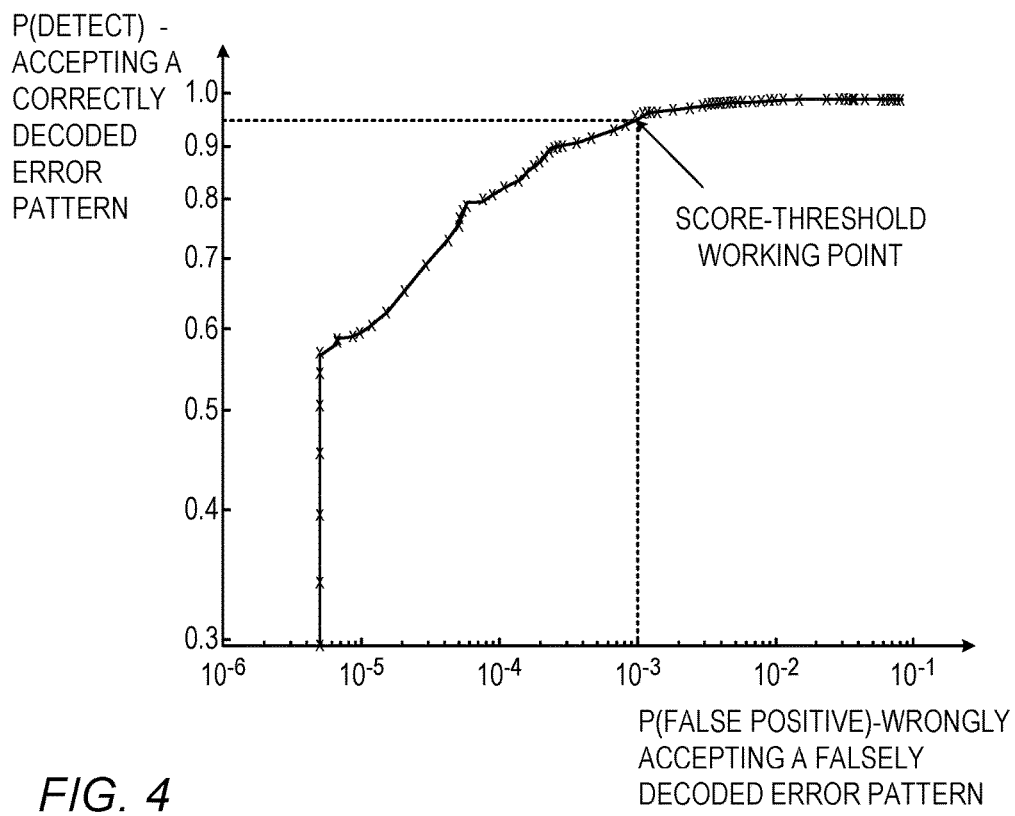
FIG. 4 is a graph that can be used for determining a score-threshold for disqualifying error-patterns generated by decoding beyond half the minimum distance of the ECC component codes, in accordance with an embodiment that is described herein.

FIG. 4 is a graph that can be used for determining a score-threshold for disqualifying error-patterns generated by decoding beyond half the minimum distance of the ECC component codes, in accordance with an embodiment that is described herein. In some embodiments, the graph in FIG. 4 is used for averaging component-code scores that are above the score-threshold. Alternatively, a single most likely error pattern (having the highest score) can be selected per component code, and then the graph can be used to accept or reject the selected error patterns. Clearly, if the most likely error pattern for a given component code is rejected, then all other error patterns associated with this component code will be rejected as well. The graph in FIG. 4 was created by running computer simulations using a GLDPC code that comprises BCH component codes.

In FIG. 4, the vertical axis denoted P(DETECT), corresponds to the probability of accepting an error pattern that was decoded correctly. The horizontal axis denoted P(FALSE POSITIVE) corresponds to the probability of wrongly accepting a falsely decoded error pattern. Note that a point on the graph corresponds to a respective score-threshold value.

Typically, it is desirable to accept with the highest possible probability error patterns that were decoded correctly, and to accept with the lowest possible probability error patterns that were decoded falsely. These requirements, however, are typically not achievable simultaneously as seen in the figure, i.e., increasing P(DETECT) results in increasing P(FALSE POSITIVE) as well.

In some embodiments, a working point on the graph is determined by selecting an acceptable value for P(FALSE POSITIVE) and deriving the corresponding P(DETECT) value using the graph. For example, for P(FALSE POSITIVE)=1e−3, we get P(DETECT) about 0.95. The memory controller then sets the score-threshold in accordance with the working point [P(FALSE POSITIVE), P(DETECT)].

In some embodiments, instead of calculating the threshold-setting score based on the component-code scores, the memory controller calculates the threshold-setting score based on the number of errors in the selected error pattern of the component codes. In such embodiments, the memory controller calculates the threshold-setting score by averaging the number of errors over some or all of the component codes of each threshold setting.

The calculation of the threshold-setting scores and the selection of the best threshold setting can be optimized in various ways. For example, in some embodiments, instead of first storing the component-code scores and then calculating the threshold-setting score by averaging the stored component-code scores per threshold setting, the memory controller calculates this average accumulatively by adding each component-code score being calculated individually. This method also applies when using a score-threshold, by summing only component-code scores above the score-threshold and counting the number of the summed elements, and finally dividing the total sum by the number of the summed elements.

Figure 5:
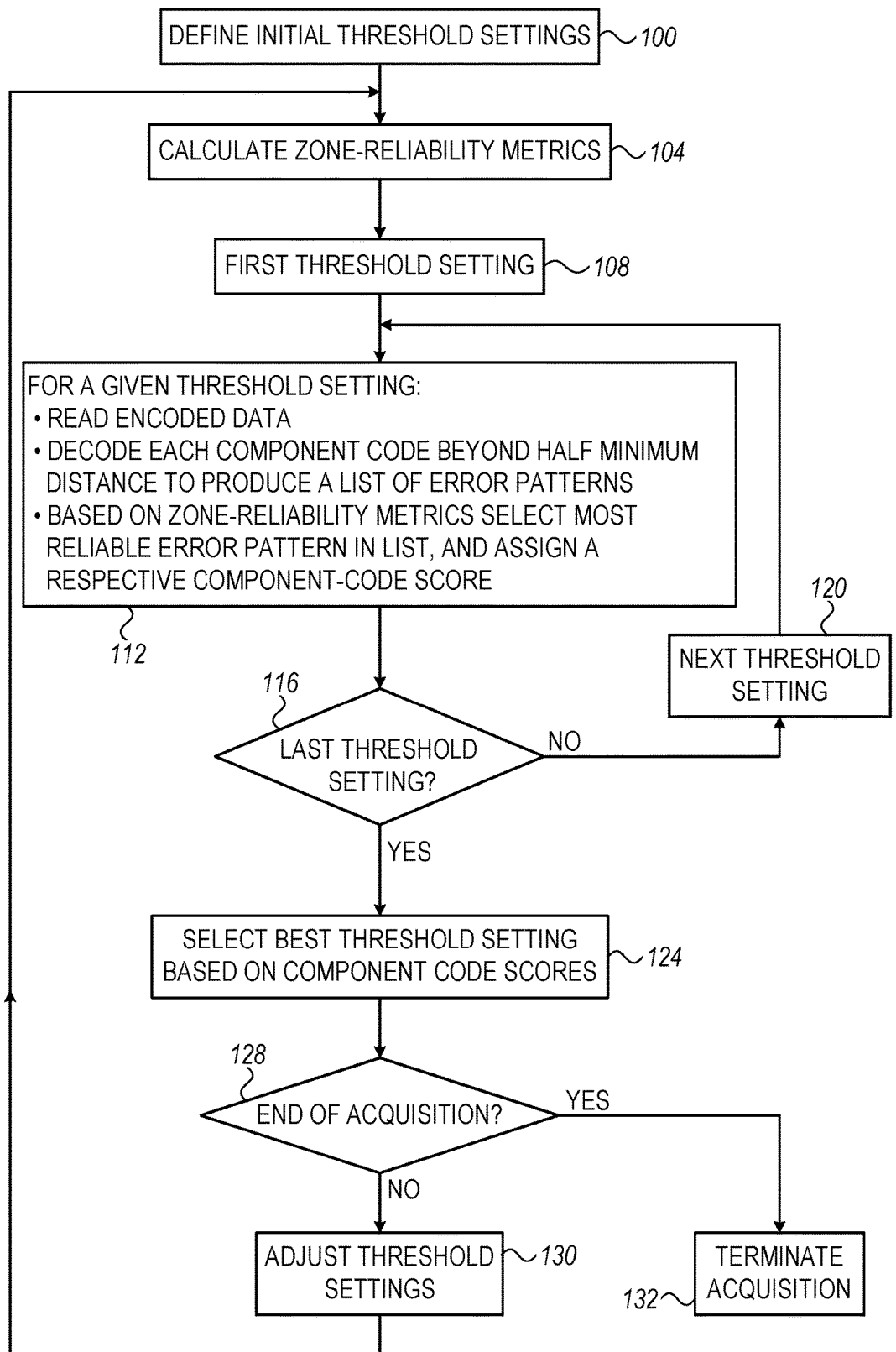
FIG. 5 is a flow chart that schematically illustrates a method for reading-threshold acquisition, in accordance with an embodiment that is described herein.

FIG. 5 is a flow chart that schematically illustrates a method for reading-threshold acquisition, in accordance with an embodiment that is described herein. The method described herein is based on reading MSB data using threshold settings of two reading-thresholds. The method is described as being executed by memory controller 40. In the description that follows we assume that a code word of a multi-component ECC (e.g., a GLDPC code) is stored as MSB data in a group of memory cells.

The method begins with memory controller 40 defining initial threshold settings, at an initialization step 100. To support low SNR values of the readout results, the reading-thresholds of the initial threshold settings are positioned so as to sample the threshold-voltage axis at a sufficiently coarse resolution. The reading-thresholds are grouped in two groups (e.g., TB1. . . TB5 and TB6. . . TB10 in FIG. 2), corresponding to the two MSB reading-thresholds.

At a metrics calculation step 104, the memory controller calculates zone-reliability metrics for the zones defined by the reading-thresholds of the threshold settings. Example methods for calculating the zone-reliability metrics are described above. At a loop initialization step 108, the memory controller selects a first threshold setting (e.g., TB1 and TB6 of FIG. 2) among the threshold settings.

At a score calculation step 112, the memory controller calculates component-code scores for the current threshold setting. The memory controller reads from the group of memory cells MSB data using the current threshold settings, and decodes the MSB data, beyond half the minimum distance of the component codes, using each of the ECC component codes to produces respective lists of error pattern candidates, as described above. The memory controller uses the zone-reliability metrics derived at step 104 to select the most reliable error-pattern candidate in each list, which serves as the respective component-code score.

At an inner loop termination step 116, the memory controller checks whether all the threshold settings have been processed, and if not, selects a subsequent threshold setting at a next threshold setting selection step 120, and loops back to step 112. Otherwise, the memory controller proceeds to a best threshold setting selection step 124, in which the memory controller calculates for each of the threshold settings a threshold-setting score, e.g., by averaging the respective component scores. The memory controller then selects the best threshold setting based on the threshold-setting scores. In alternative embodiments, other suitable methods for selecting the best threshold setting, some of which described above, can also be used.

At an acquisition termination step 128, the memory controller checks whether the acquisition process is completed using any suitable termination criterion. For example, the memory controller may decide that the acquisition is completed when the sampling resolution of the reading-thresholds of the current threshold settings is finer than a predefined threshold resolution.

When at step 128 the acquisition is not completed, the memory controller adjusts the threshold settings for the next iteration at an adjustment step 130, and loops back to step 104 to calculate the zone-reliability metrics for the updated zones. Otherwise, the acquisition is completed, and the memory controller proceeds to an acquisition termination step 132, in which the memory controller uses the best threshold setting for subsequent reading operations from the memory device.

At step 130, the memory controller may adjust the threshold settings in various ways. For example, in some embodiments, the memory controller adjusts the threshold settings by using the reading-thresholds of the selected best threshold setting as anchors for positioning the reading-thresholds of the updated threshold settings. In some embodiments, the reading-thresholds of the updated threshold settings sample the threshold-voltage axis at a finer resolution. For example, the voltage intervals between adjacent reading-thresholds may be reduced by half in each iteration transition.

The embodiments described above are given by way of example, and other suitable embodiments can also be used. For example, in the method of FIG. 4, the memory controller calculates the zone-reliability metrics at step 104 at the beginning of the iterations, after the threshold settings have been updated. In alternative embodiments, the memory controller defines the threshold settings for all the iterations beforehand. The memory controller calculates the respective zone-reliability metrics and stores these metrics in a table to be used during the acquisition.

It will be appreciated that the embodiments described above are cited by way of example, and that the following claims are not limited to what has been particularly shown and described hereinabove. Rather, the scope includes both combinations and sub-combinations of the various features described hereinabove, as well as variations and modifications thereof which would occur to persons skilled in the art upon reading the foregoing description and which are not disclosed in the prior art. Documents incorporated by reference in the present patent application are to be considered an integral part of the application except that to the extent any terms are defined in these incorporated documents in a manner that conflicts with the definitions made explicitly or implicitly in the present specification, only the definitions in the present specification should be considered.

The invention claimed is:

1. A storage device, comprising:
a nonvolatile memory comprising multiple memory cells, configured to store data by setting the memory cells to analog voltages representative of respective storage values; and
storage circuitry, which is configured to:
store in a group of the memory cells encoded data that was encoded by an encoder using an error correcting code (ECC), wherein the ECC comprises M component codes and wherein each of the component codes corrects up to a predefined number of correctable errors;
define N threshold settings, each threshold setting specifying positions of one or more reading-thresholds on a threshold-voltage axis;
read the encoded data from the group of the memory cells using each of the threshold settings to produce N respective readouts, by comparing the analog voltages of the memory cells in the group to the reading-thresholds of the respective threshold settings;
decode each of the N readouts using each of the M component codes of the ECC, so as to produce M decoded readouts corresponding respectively to each threshold setting, including attempting to decode at least one of the M component codes by considering error patterns having a number of errors above the respective number of correctable errors;
calculate for the N threshold settings, N respective threshold-setting scores, by calculating for each threshold setting M component-code scores that are indicative of levels of confidence in the respective decoded readouts, and calculating the respective threshold-setting score based on the M component-code scores;
based on the N threshold-setting scores, select among the N threshold settings, a threshold setting that is expected to result in a best readout performance among the N threshold settings; and
read data from the memory using the selected threshold setting.

2. The storage device according to claim 1, wherein the ECC comprises a generalized low-density parity-check (GLDPC) code, and wherein the storage circuitry is configured to store the encoded data that was encoded using the GLDPC code.

3. The storage device according to claim 1, wherein the storage circuitry is configured to:
calculate the component-code scores based on first reading-thresholds having first respective positions;
define, based on the selected threshold setting, second reading-thresholds having second positions different from the first positions; and
calculate the component-code scores based on the second reading-thresholds.

4. The storage device according to claim 1, wherein the storage circuitry is configured to:
calculate the component-code scores by decoding a given component code beyond half a minimum distance of the component codes to produce one or more error-pattern candidates, calculating for each error-pattern candidate a respective candidate-score; and
calculate the component-code score corresponding to the given component code based on the candidate-scores.

5. The storage device according to claim 4, wherein the storage circuitry is configured to identify a most reliable error pattern among the error-pattern candidates, and to assign the candidate-score of the identified error pattern as the component-code score.

6. The storage device according to claim 4, wherein the storage circuitry is configured to:
assign multiple zone-reliability metrics to threshold-voltage zones defined by the reading-thresholds;
identify to which zones the memory cells corresponding to erroneous bits in the respective error-pattern candidate belong; and
calculate the candidate-score based on the respective zone-reliability metrics.

7. The storage device according to claim 1, wherein the storage circuitry is configured to calculate each of the threshold-setting scores by averaging the respective component-code scores.

8. The storage device according to claim 7, wherein the storage circuitry is configured to average the component-code scores whose values exceed a predefined score-threshold.

9. The storage device according to claim 7, wherein the storage circuitry is configured to average a predefined number of the component-code scores having highest values among the component-code scores.

10. A method, comprising:
in a nonvolatile memory comprising multiple memory cells that store data by setting the memory cells to analog voltages representative of respective storage values, storing in a group of the memory cells encoded data that was encoded by an encoder using an error correcting code (ECC), wherein the ECC comprises M component codes and wherein each of the component codes corrects up to a predefined number of correctable errors;
defining N threshold settings, each threshold setting specifying positions of one or more reading-thresholds on a threshold-voltage axis;
reading the encoded data from the group of the memory cells using each of the threshold settings to produce N respective readouts, by comparing the analog voltages of the memory cells in the group to the reading-thresholds of the respective threshold settings;
decoding each of the N readouts using each of the M component codes of the ECC, so as to produce M decoded readouts corresponding respectively to each threshold setting, including attempting to decode at least one of the M component codes by considering error patterns having a number of errors above the respective number of correctable errors;
calculating for the N threshold settings, N respective threshold-setting scores, by calculating for each threshold setting M component-code scores that are indicative of levels of confidence in the respective decoded readouts, and calculating the respective threshold-setting score based on the M component-code scores;
based on the N threshold-setting scores, selecting among the N threshold settings, a threshold setting that is expected to result in a best readout performance among the N threshold settings; and
reading data from the memory using the selected threshold setting.

11. The method according to claim 10, wherein the ECC comprises a generalized low-density parity-check (GLDPC) code, and wherein storing the encoded data comprises storing the encoded data that was encoded using the GLDPC code.

12. The method according to claim 10, wherein calculating the component-code scores comprises:
calculating the component-code scores based on first reading-thresholds having first respective positions;
defining, based on the selected threshold setting, second reading-thresholds having second positions different from the first positions; and
calculating the component-code scores based on the second reading-thresholds.

13. The method according to claim 10, wherein calculating the component-code scores comprises:
decoding a given component code beyond half a minimum distance of the component codes to produce one or more error-pattern candidates; calculating for each error-pattern candidate a respective candidate-score; and
calculating the component-code score corresponding to the given component code based on the candidate-scores.

14. The method according to claim 13, wherein calculating the component-code score comprises:
identifying a most reliable error pattern among the error-pattern candidates; and
assigning the candidate-score of the identified error pattern as the component-code score.

15. The method according to claim 13, further comprising:
assigning multiple zone-reliability metrics to threshold-voltage zones defined by the reading-thresholds;
identifying to which zones the memory cells corresponding to erroneous bits in the respective error-pattern candidate belong; and
calculating the candidate-score based on the respective zone-reliability metrics.

16. The method according to claim 10, wherein selecting the threshold setting comprises:
calculating each of the threshold-setting scores by averaging the respective component-code scores.

17. The method according to claim 16, wherein averaging the component-code scores comprises averaging the component-code scores whose values exceed a predefined score-threshold.

18. The method according to claim 16, wherein averaging the component-code scores comprises averaging a predefined number of the component-code scores having highest values among the component-code scores.

* * * * *